(12) United States Patent
Bao et al.

(10) Patent No.: US 12,002,689 B2
(45) Date of Patent: Jun. 4, 2024

(54) SEMICONDUCTOR EQUIPMENT REGULATION METHOD AND SEMICONDUCTOR DEVICE FABRICATION METHOD

(71) Applicant: CHANGXIN MEMORY TECHNOLOGIES, INC., Hefei (CN)

(72) Inventors: Xifei Bao, Hefei (CN); Runsheng Shen, Hefei (CN)

(73) Assignee: Changxin Memory Technologies, Inc., Hefei (CN)

( * ) Notice: Subject to any disclaimer, the term of this patent is extended or adjusted under 35 U.S.C. 154(b) by 400 days.

(21) Appl. No.: 17/455,515

(22) Filed: Nov. 18, 2021

(65) Prior Publication Data
US 2022/0076969 A1 Mar. 10, 2022

Related U.S. Application Data

(63) Continuation of application No. PCT/CN2021/097613, filed on Jun. 1, 2021.

(30) Foreign Application Priority Data

Jun. 16, 2020 (CN) .......................... 202010547902.2

(51) Int. Cl.
 *H01L 21/00* (2006.01)
 *H01L 21/67* (2006.01)
 *H10B 12/00* (2023.01)
(52) U.S. Cl.
 CPC .. *H01L 21/67069* (2013.01); *H01L 21/67253* (2013.01); *H10B 12/03* (2023.02)
(58) Field of Classification Search
 CPC ......... H01L 21/67069; H01L 21/67253; H01L 21/6715; H10B 12/03
 See application file for complete search history.

(56) References Cited

U.S. PATENT DOCUMENTS 7,418,921 B2 * 9/2008 Tsuji ................... C23C 16/4583
118/728
10,233,566 B2 * 3/2019 List, III ................. C30B 25/14
(Continued)

FOREIGN PATENT DOCUMENTS

CN 1396634 A * 2/2003
CN 102148191 A 8/2011
(Continued)

OTHER PUBLICATIONS

International Search Report as cited in PCT Application No. PCT/CN2021/097613 mailed Sep. 6, 2021, 8 pages.
(Continued)

*Primary Examiner* — Laura M Menz
(74) *Attorney, Agent, or Firm* — Cooper Legal Group, LLC (57) ABSTRACT

The present application relates to a semiconductor equipment regulation method, including: providing a simulated wafer; placing the simulated wafer in an etching chamber, and conditioning a temperature in the chamber by using a temperature control device while the simulated wafer is etched by using an etching gas; during the etching process, forming a polymer layer on a surface of each etch hole; acquiring a thickness distribution map of the polymer layer in the entire simulated wafer; comparing the acquired thickness distribution map with a target thickness distribution map; and adjusting a temperature control effect through using the temperature control device on each region of the simulated wafer according to a result of the comparison, so as to adjust thickness uniformity of the polymer layer in the entire wafer.

16 Claims, 5 Drawing Sheets

(56) References Cited

U.S. PATENT DOCUMENTS

| | | | |
|---|---|---|---|
| 11,062,886 B2 * | 7/2021 | Peng | H01L 21/67248 |
| 2006/0132769 A1 * | 6/2006 | Iwa | G01N 15/1434 |
| | | | 356/336 |
| 2006/0292877 A1 | 12/2006 | Lake | |
| 2007/0037390 A1 * | 2/2007 | Tsuji | C23C 16/401 |
| | | | 438/680 |
| 2007/0211932 A1 * | 9/2007 | Lee | G06T 7/0004 |
| | | | 382/145 |
| 2008/0132067 A1 | 6/2008 | Ma | |
| 2014/0311675 A1 * | 10/2014 | Yi | H01L 21/67109 |
| | | | 156/345.33 |
| 2018/0187331 A1 * | 7/2018 | List, III | C23C 16/26 |
| 2019/0164730 A1 * | 5/2019 | Peng | H01J 37/32798 |
| 2022/0043051 A1 * | 2/2022 | Cheng | G01R 31/2831 |
| 2022/0076969 A1 * | 3/2022 | Bao | H01L 21/67069 |
| 2023/0236569 A1 * | 7/2023 | Zhang | G05B 19/4099 |
| | | | 700/121 |
| 2023/0417708 A1 * | 12/2023 | Lal | G01N 29/07 |

FOREIGN PATENT DOCUMENTS

| | | | | |
|---|---|---|---|---|
| CN | 102592986 A | | 7/2012 | |
| CN | 102931133 A | | 2/2013 | |
| CN | 105742229 A | | 7/2016 | |
| CN | 106206421 A | | 12/2016 | |
| CN | 107895721 A | | 4/2018 | |
| CN | 108520852 A | | 9/2018 | |
| CN | 108520852 A | * 9/2018 | H01J 37/3244 |
| CN | 104143521 B | * 1/2019 | H01L 21/02063 |
| CN | 109473378 A | * 3/2019 | H01L 21/306 |
| CN | 113808966 A | * 12/2021 | H01L 21/67069 |
| CN | 113808966 B | * 10/2023 | H01L 21/67069 |
| TW | 587152 B | | 5/2004 | |
| TW | 202344940 A | * 11/2023 | G05B 19/4099 |
| WO | WO-2004025313 A1 | * 3/2004 | G01R 31/2831 |
| WO | WO-2005099088 A1 | * 10/2005 | H03H 3/0073 |
| WO | WO-2021254136 A1 | * 12/2021 | H01L 21/67069 |
| WO | WO-2022028102 A1 | * 2/2022 | G01R 31/2831 |
| WO | WO-2022225221 A1 | * 10/2022 | |

OTHER PUBLICATIONS

Written Opinion of the International Search Authority in the corresponding international application No. PCT/CN2021/097613, mailed on Sep. 6, 2021.

* cited by examiner

SEMICONDUCTOR EQUIPMENT REGULATION METHOD AND SEMICONDUCTOR DEVICE FABRICATION METHOD

CROSS-REFERENCE TO RELATED APPLICATIONS

This application is a continuation application of International Patent Application No. PCT/CN2021/097613, filed on Jun. 1, 2021, which claims priority to Chinese Patent Application No. 202010547902.2, filed with the Chinese Patent Office on Jun. 16, 2020 and entitled "SEMICONDUCTOR EQUIPMENT DEBUGGING METHOD AND SEMICONDUCTOR DEVICE FABRICATION METHOD". International Patent Application No. PCT/CN2021/097613 and Chinese Patent Application No. 202010547902.2 are incorporated herein by reference in their entireties.

TECHNICAL FIELD

The present application relates to the field of semiconductors, and in particular, to a semiconductor equipment regulation method and a semiconductor device fabrication method.

BACKGROUND

In the field of semiconductors, a dynamic random access memory cell includes a capacitor for storing charges and a transistor for accessing the capacitor. With continuous decrease in a geometric size of a dynamic random access memory according to Moore's law, an aspect ratio of the capacitor even exceeds 50:1, and a height of a capacitor hole in the capacitor exceeds 2800 nm.

During a process of forming the capacitor hole by etching, an etching gas reacts with a to-be-etched material layer to form a polymer layer attached to a sidewall of the capacitor hole. The polymer layer can prevent excessive side etching of the capacitor hole during the etching process, which can ensure that the formed capacitor hole maintains a vertical morphology. However, due to a difference in temperatures and other conditions in different regions of a wafer during etching, thicknesses of polymer layers formed on sidewalls of capacitor holes in the different regions of the wafer are not uniform, which results in a difference in morphologies of the capacitor holes formed in the different regions of the wafer. For example, the polymer layers are not formed on the sidewalls of the capacitor holes in some regions, while too thick polymer layers may be formed on the sidewalls of the capacitor holes in some other regions.

SUMMARY

In view of the above, a semiconductor equipment regulation method and a semiconductor device fabrication method are required to be provided with respect to the above technical problems, which have an effect of forming uniform polymer layers on a wafer.

A semiconductor equipment regulation method includes:
providing a simulated wafer;
placing the simulated wafer in an etching chamber, and conditioning a temperature in the etching chamber by using a temperature control device while the simulated wafer is etched by using an etching gas; during the etching process, forming a polymer layer on a surface of the simulated wafer;
measuring a thickness of the polymer layer and acquiring a thickness distribution map;
comparing the acquired thickness distribution map with a target thickness distribution map; and
adjusting a temperature control effect through using the temperature control device on each region of the simulated wafer according to a result of the comparison, so as to adjust a thickness of the polymer layer formed during next etching process.

The present application further provides a semiconductor device fabrication method, including:
providing a simulated wafer, a first film-stack structure including alternately stacked support layers and sacrificial layers being formed on a surface of the simulated wafer;
placing the simulated wafer in an etching chamber, and conditioning a temperature in the etching chamber by using a temperature control device while the first film-stack structure is etched by using an etching gas; during the etching process, forming a first polymer layer on the surface of the simulated wafer;
measuring a thickness of the first polymer layer and acquiring a thickness distribution map;
comparing the acquired thickness distribution map with a target thickness distribution map;
adjusting a temperature control effect through using the temperature control device on each region of the simulated wafer according to a result of the comparison, so as to adjust a thickness of the first polymer layer formed during next etching process; and
placing a product wafer in the etching chamber after thickness uniformity of the first polymer layer in the entire wafer reaches a target value, the product wafer including a second film-stack structure in which support layers and sacrificial layers are alternately stacked; etching the second film-stack structure by using the etching gas while the temperature control device conditions a temperature of the product wafer, so as to form a plurality of etch holes in the second film-stack structure; and forming a second polymer layer on a surface of each etch hole during the etching process.

Reference numerals: 10: capacitor hole; 11: sacrificial layer; 12: support layer; 13: polymer layer; 20: capacitor hole; 21: sacrificial layer; 22: support layer; 23: polymer layer.

DESCRIPTION OF EMBODIMENTS

In order to facilitate understanding of the present application, a more complete description of the present application is provided below with reference to the relevant drawings. Preferred embodiments of the present application are given in the drawings. However, the present application may be implemented in many different forms and is not limited to the embodiments described herein. Instead, these embodiments are provided to make the disclosure of the present application more thorough and complete.

Unless otherwise defined, all of the technical and scientific terms used herein have the same meanings as would generally understood by those skilled in the technical field of the present application. The terms used herein in the specification of the present application are for the purpose of describing specific embodiments only, and are not intended to limit the present application. The term "and/or" used herein includes any and all combinations of one or more related listed items.

In the description of the present application, it is to be understood that the orientation or position relationship indicated by the terms "upper", "lower", "vertical", "horizontal", "inner", "outer", or the like are based on the orientation or position relationship shown in the accompanying drawings and are intended to facilitate the description of the present application and simplify the description only, rather than indicating or implying that the device or element referred to must have a particular orientation or be constructed and operated in a particular orientation, and therefore are not to be interpreted as limiting the present application.

In the field of semiconductors, a dynamic random access memory cell includes a capacitor for storing charges and a transistor for accessing the capacitor. With continuous decrease in a geometric size of a dynamic random access memory according to Moore's law, an aspect ratio of the capacitor even exceeds 50:1, and a height of a capacitor hole in the capacitor exceeds 2800 nm.

During a process of forming the capacitor hole by etching, an etching gas reacts with a to-be-etched material layer to form a polymer layer attached to a sidewall of the capacitor hole. The polymer layer can prevent excessive side etching of the capacitor hole during the etching process, which can ensure that the formed capacitor hole maintains a vertical morphology. However, due to a difference in temperatures and other conditions in different regions of a wafer during etching, thicknesses of polymer layers formed on sidewalls of capacitor holes in the different regions of the wafer are not uniform, which results in a difference in morphologies of the capacitor holes formed in the different regions of the wafer. For example, the polymer layers are not formed on the sidewalls of the capacitor holes in some regions, while too thick polymer layers may be formed on the sidewalls of the capacitor holes in some other regions.

Figure 1:
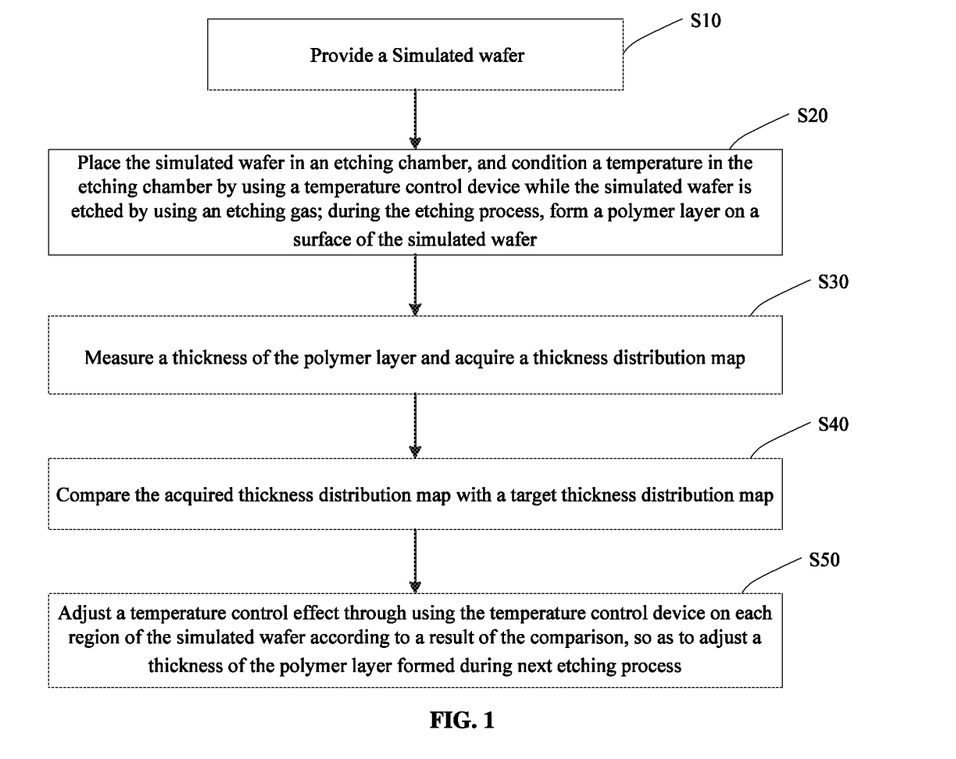
FIG. 1 is a flowchart of a semiconductor equipment regulation method according to an embodiment of the present application.

In order to solve the above technical problems, as shown in FIG. 1, the present application provides a semiconductor equipment regulation method, including the following steps.

In step S10, a simulated wafer is provided.

In step S20, the simulated wafer is placed in an etching chamber, and a temperature in the etching chamber is conditioned by using a temperature control device while the simulated wafer is etched by using an etching gas; during the etching process, a polymer layer is formed on a surface of the simulated wafer.

In step S30, a thickness of the polymer layer is measured and a thickness distribution map is acquired.

In step S40, the acquired thickness distribution map is compared with a target thickness distribution map.

In step S50, a temperature control effect through using the temperature control device on each region of the simulated wafer is adjusted according to a result of the comparison, so as to adjust a thickness of the polymer layer formed during next etching process.

For step S10, in one embodiment, the simulated wafer may be a test wafer for performing a test, the simulated wafer may be made of silicon, germanium, GaAs, InP, GaN, or the like, the simulated wafer may be fabricated to have a circuit element or device structure the same as that on a corresponding product wafer, and dimensions of the simulated wafer may be exactly the same as those of the product wafer.

For step S20, in one embodiment, the temperature control device includes a plurality of separate heating plates which may be adjustably and fixedly connected to an inner wall of the etching chamber through screws. In one embodiment, the heating plates may be adjustably and fixedly connected to a top of the etching chamber through screws. When the screw is turned, a distance between the heating plate and the simulated wafer in the etching chamber also changes, resulting in a change in heat conduction efficiency between the heating plate and the simulated wafer. Since the temperature control device includes a plurality of separate heating plates, the heat conduction efficiency between each heating plate and the simulated wafer can be changed separately, and heating situations in the regions of the simulated wafer can be controlled separately, so as to achieve a purpose of separately adjusting temperature control effects on different regions of the simulated wafer.

In one embodiment, a first film-stack structure including alternately stacked support layers and sacrificial layers is formed on a surface of the simulated wafer. The support layer may be a titanium nitride layer, and the sacrificial layer may be an oxide layer. The temperature control device conditions a temperature in the chamber while the simulated wafer is etched by using an etching gas. The etching gas in the sacrificial layer is different from that in the support layer. The etching gas in the support layer may mainly be tetrafluoromethane ($CF_4$), and the etching gas in the sacrificial layer may mainly be hexafluoro-2-butyne ($C_4F_6$). During this etching process, the higher a ratio of $C_4F_6$ is, the more the polymer layers are deposited.

The next etching process includes a process of etching a product wafer. During the process of etching the simulated wafer so as to make the detection of the thickness of the polymer layer more obvious, a flow rate of at least one etching gases is greater than that of the corresponding etching gas during the process of etching the product wafer. For example, a gas flow rate of the etching gas during the process of etching the simulated wafer is greater than that of the corresponding etching gas during the process of etching the product wafer, and a gas flow rate of $CF_4$ ranges from 15 sccm to 50 sccm, which may be 15 sccm, 30 sccm or 50 sccm in one embodiment. A gas flow rate of $C_4F_6$ may range from 50 sccm to 60 sccm, which may be 50 sccm, 55 sccm or 60 sccm in one embodiment. However, the above data is used only as examples, and specific values of the gas flow rate of $CF_4$ and $C_4F_6$ in practical embodiments are not limited to the above data. Since the gas flow rate of the etching gas is increased, more polymer layers are deposited, which may magnify differences in thicknesses of the polymer layers in different regions, facilitating an operator to regulate semiconductor equipment.

During the process of etching the simulated wafer so as to make the detection of the thickness of the polymer layer more obvious, etching power may be less than that during the process of etching the product wafer, and after deposition of the polymer layer, the differences in the thicknesses of the polymer layers in different regions may be magnified, helping to regulate the semiconductor equipment.

For step S30, in one embodiment, the thickness of the polymer layer is measured through a measuring machine, and the thickness distribution map of the polymer layer is generated according to a measured value. The method of acquiring thickness distribution according to a measurement result is known by those skilled in the art and is not described in detail herein.

For step S40, in one embodiment, the acquired thickness distribution map is compared with the target thickness distribution map, differences between thickness values on the acquired thickness distribution map and thickness values on the target thickness distribution map may be calculated, and the resulting differences are made into a difference distribution map. The target thickness distribution map is an initial thickness distribution map of the simulated wafer in step S10.

For step S50, in one embodiment, the thickness of the polymer layer formed during the etching process is inversely proportional to a temperature the simulated wafer, and the step of adjusting a distance between the heating plate and the simulated wafer according to the result of the comparison to adjust a temperature control effect on each region of the surface of the simulated wafer includes the following steps.

In step S501, a region of the simulated wafer where the thickness of the polymer layer differs from the target thickness is positioned according to the result of the comparison.

In step S502, the heating plate at a corresponding position of the region is adjusted, a distance between the heating plate at the corresponding position and the simulated wafer is decreased if a difference between the thickness of the polymer layer in the region of which the target thickness in the corresponding region is greater than a first preset value, and the distance between the heating plate at the corresponding position and the simulated wafer is increased if the difference between the thickness of the polymer layer in the region of which the target thickness in the corresponding region is less than a second preset value.

In one embodiment, the thickness distribution map and the target thickness distribution map can be stacked for comparison to obtain a thickness difference map of regions of the thickness distribution map and the target thickness distribution map. The heating plate may be adjustably and fixedly connected to an inner wall of the etching chamber through a screw. When the screw is turned, a distance between the heating plate and the simulated wafer in the etching chamber also changes, resulting in a change in heat conduction efficiency between the heating plate and the simulated wafer. The temperature control device includes a plurality of separate heating plates, and the heat conduction efficiency between each heating plate and the simulated wafer can be changed separately; therefore, heating situations in the regions of the simulated wafer can be controlled separately, and the heating plate corresponding to a region with a great difference can be adjusted separately, so as to achieve purposes of decreasing a distance between the heating plate corresponding to a region, in which a difference between the thickness of the polymer layer in the region of which the target thickness is greater than a first preset value, and the simulated wafer, and increasing the distance between the heating plate corresponding to the region, in which the difference between the thickness of the polymer layer in the region of which the target thickness is less than a second preset value, and the simulated wafer.

Figure 2:
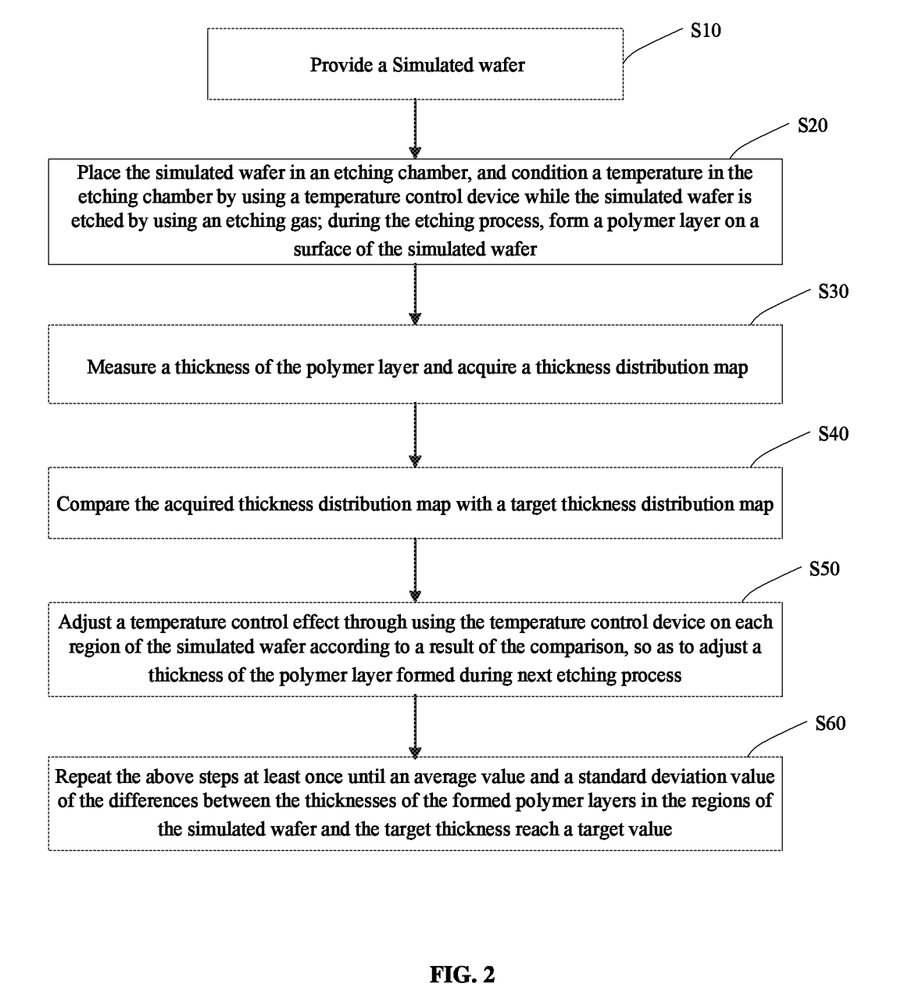
FIG. 2 is a flowchart of a semiconductor equipment regulation method according to another embodiment of the present application.

As shown in FIG. 2, in one embodiment, the semiconductor equipment regulation method according to the present application includes:

In step S10, a simulated wafer is provided.

In step S20, the simulated wafer is placed in an etching chamber, and a temperature in the etching chamber is conditioned by using a temperature control device while the simulated wafer is etched by using an etching gas; during the etching process, a polymer layer is formed on a surface of the simulated wafer.

In step S30, a thickness of the polymer layer is measured and a thickness distribution map is acquired.

In step S40, the acquired thickness distribution map is compared with a target thickness distribution map.

In step S50, a temperature control effect through using the temperature control device on each region of the simulated wafer is adjusted according to a result of the comparison, so as to adjust a thickness of the polymer layer formed during next etching process on the entire wafer.

In step S60, the above steps are repeated at least once until an average value and a standard deviation value of the differences between the thicknesses of the formed polymer layers in the regions of the simulated wafer and the target thickness reach a target value.

In this embodiment, steps S10 to S50 are exactly the same as steps S10 to S50 in the previous embodiment, and are not described in detail herein.

For step S60, after initial adjustment, it cannot be determined whether the initial adjustment has achieved a desired purpose. Therefore, steps S10 to S50 are repeated at least once to enable the semiconductor equipment to be detected again after adjustment, and formal processing of the product wafer is performed until it is determined that thickness uniformity of the polymer layers in the entire wafer is satisfied, which can further improve distribution uniformity of the polymer layers in formal production.

With the above technical means, the thickness of the polymer layer formed during the etching process is inversely proportional to the temperature of the simulated wafer, regions where polymer layers are either too thick or too thin are detected based on formation of the polymer layers on the simulated wafer, and distribution of thicknesses of the polymer layers on a surface of the entire wafer can be controlled by adjusting the temperature control effect through using the temperature control device on each region of the simulated wafer, so as to achieve a purpose of improving distribution uniformity of the polymer layer in formal production.

Figure 3:
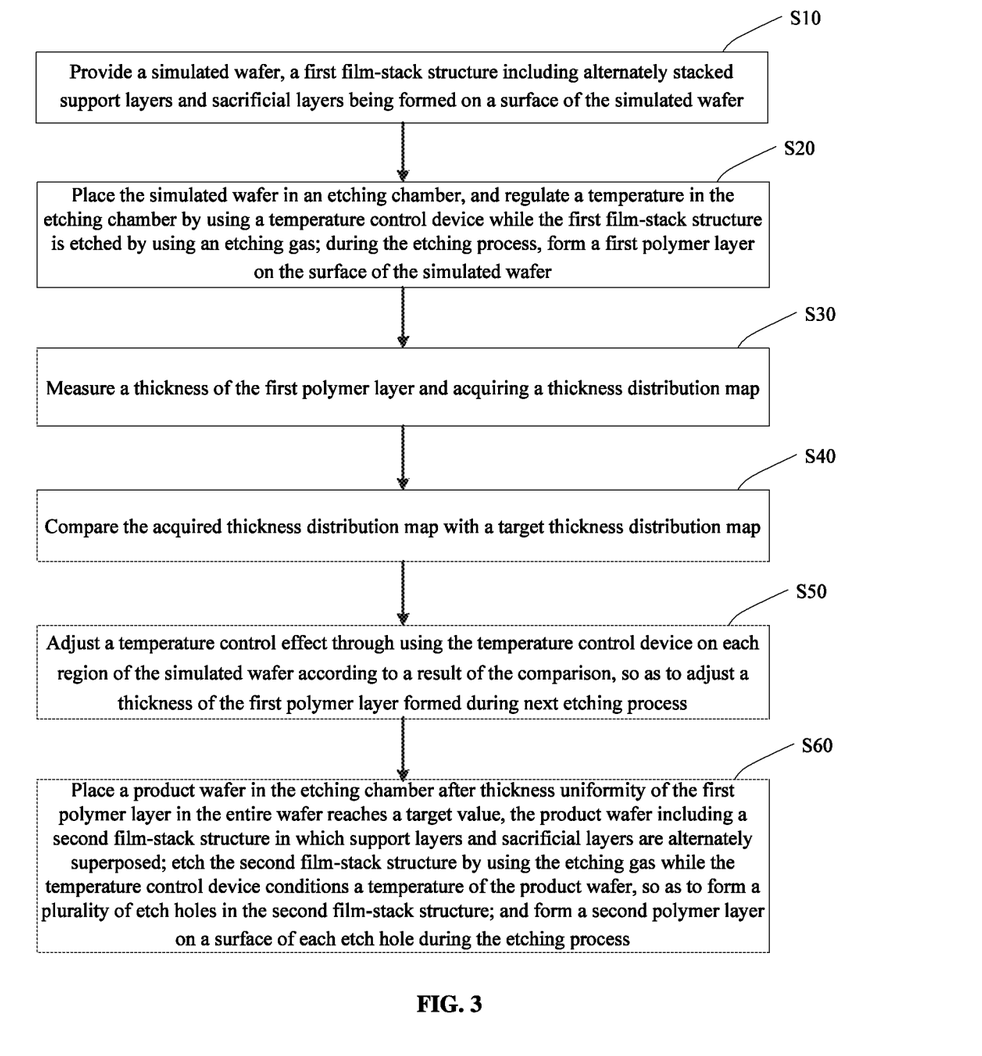
FIG. 3 is a flowchart of a semiconductor device fabrication method according to an embodiment of the present application.

As shown in FIG. 3, the present application further provides a semiconductor device fabrication method, including the following steps.

In step S10, a simulated wafer is provided, and a first film-stack structure including alternately stacked support layers and sacrificial layers is formed on a surface of the simulated wafer.

In step S20, the simulated wafer is placed in an etching chamber, and a temperature in the etching chamber is conditioned by using a temperature control device while the simulated wafer is etched by using an etching gas; during the etching process, a first polymer layer is formed on a surface of the simulated wafer.

In step S30, a thickness of the first polymer layer is measured and a thickness distribution map is acquired.

In step S40, the acquired thickness distribution map is compared with a target thickness distribution map.

In step S50, a temperature control effect through using the temperature control device on each region of the simulated wafer is adjusted according to a result of the comparison, so as to adjust a thickness of the first polymer layer formed during next etching process.

In step S60, a product wafer is placed in the etching chamber after thickness uniformity of the first polymer layer in the entire wafer reaches a target value, and the product wafer includes a second film-stack structure in which support layers and sacrificial layers are alternately stacked; the second film-stack structure is etched by using the etching gas while the temperature control device conditions a temperature of the product wafer, so as to form a plurality of etch holes in the second film-stack structure; and a second polymer layer is formed on a surface of each etch hole during the etching process.

For step S10, in one embodiment, the simulated wafer may be a test wafer for performing a test, the simulated wafer may be made of silicon, germanium, GaAs, InP, GaN, or the like, the simulated wafer may be fabricated to have a circuit element or device structure the same as that on a corresponding product wafer, and dimensions of the simulated wafer may be exactly the same as those of the product wafer.

In one embodiment, support layers and sacrificial layers are alternately stacked on a surface of the simulated wafer to form a first film-stack structure. The support layer may be a titanium nitride layer, and the sacrificial layer may be an oxide layer.

For step S20, in one embodiment, the simulated wafer is etched by using an etching gas while the temperature control device conditions a temperature in the chamber. The etching gas in the sacrificial layer is different from that in the support layer. The etching gas in the support layer may mainly be tetrafluoromethane ($CF_4$), and the etching gas in the sacrificial layer may mainly be hexafluoro-2-butyne ($C_4F_6$). During this etching process, the higher a ratio of $C_4F_6$ is, the more the first polymer layers are deposited.

The next etching process includes a process of etching a product wafer. During the process of etching the simulated wafer so as to make the detection of the thickness of the first polymer layer more obvious, a flow rate of at least one etching gases is greater than that of the corresponding etching gas during the process of etching the product wafer. For example, a gas flow rate of the etching gas during the process of etching the simulated wafer is greater than that of the corresponding etching gas during the process of etching the product wafer, and a gas flow rate of $CF_4$ ranges from 15 sccm to 50 sccm, which may be 15 sccm, 30 sccm or 50 sccm in one embodiment. A gas flow rate of $C_4F_6$ may range from 50 sccm to 60 sccm, which may be 50 sccm, 55 sccm or 60 sccm in one embodiment. However, the above data is used only as examples, and specific values of the gas flow rate of $CF_4$ and $C_4F_6$ in practical embodiments are not limited to the above data. Since the gas flow rate of the etching gas is increased, more first polymer layers are deposited, which may magnify differences in thicknesses of the first polymer layers in different regions, facilitating the operator to regulate semiconductor equipment.

During the process of etching the simulated wafer so as to make the detection of the thickness of the first polymer layer more obvious, etching power may be less than that during the process of etching the product wafer, and after deposition of the first polymer layer, the differences in the thicknesses of the first polymer layers in different regions may be magnified, helping to regulate the semiconductor equipment.

For step S30, in one embodiment, the thickness of the first polymer layer is measured through a measuring machine, and the thickness distribution map of the first polymer layer is generated according to a measured value. The method of acquiring thickness distribution according to a measurement result is known by those skilled in the art and is not described in detail herein.

For step S40, in one embodiment, the acquired thickness distribution map is compared with the target thickness distribution map, differences between thickness values on the thickness distribution map and thickness values on the target thickness distribution map may be calculated, and the resulting differences are made into a difference distribution map. The target thickness distribution map is a thickness distribution map of the polymer layer when a capacitor hole with a vertical sidewall required by the product is obtained.

For step S50, in one embodiment, the temperature control device includes a plurality of separate heating plates which may be adjustably and fixedly connected to an inner wall of the etching chamber through screws. In one embodiment, the heating plates may be adjustably and fixedly connected to a top of the etching chamber through screws. When the screw is turned, a distance between the heating plate and the simulated wafer in the etching chamber also changes, resulting in a change in heat conduction efficiency between the heating plate and the simulated wafer. Since the temperature control device includes a plurality of separate heating plates, the heat conduction efficiency between each heating plate and the simulated wafer can be changed separately, and heating situations in the regions of the simulated wafer can be controlled separately, so as to achieve a purpose of separately adjusting temperature control effects on different regions of the simulated wafer.

In one embodiment, the step of adjusting positions of the heating plate and the simulated wafer according to the result of the comparison to adjust a temperature control effect of the heating plate on the simulated wafer includes:

In step S501, a region of the simulated wafer where the thickness of the first polymer layer differs from the target thickness is determined according to the result of the comparison.

In step S502, the heating plate at a corresponding position of the region is adjusted, a distance between the heating plate at the corresponding position and the simulated wafer is decreased if a difference between the thickness of the first polymer layer in the region of which the target thickness in the corresponding region is greater than a first preset value, and the distance between the heating plate at the corresponding position and the simulated wafer is increased if the difference between the thickness of the first polymer layer in the region of which the target thickness in the corresponding region is less than a second preset value.

In one embodiment, the thickness distribution map and the target thickness distribution map can be stacked for comparison to obtain a thickness difference map of regions of the thickness distribution map and the target thickness distribution map. The heating plate may be adjustably and fixedly connected to an inner wall of the etching chamber through a screw. When the screw is turned, a distance between the heating plate and the simulated wafer in the etching chamber also changes, resulting in a change in heat conduction efficiency between the heating plate and the simulated wafer. The temperature control device includes a plurality of separate heating plates, and the heat conduction efficiency between each heating plate and the simulated wafer can be changed separately; therefore, heating situations in the regions of the simulated wafer can be controlled separately, and the heating plate corresponding to a region with a great difference can be adjusted separately, so as to achieve purposes of decreasing a distance between the heating plate corresponding to a region, in which a difference between the thickness of the first polymer layer in the region of which the target thickness is greater than a first preset value, and the simulated wafer, and increasing the distance between the heating plate corresponding to the region, in which the difference between the thickness of the first polymer layer in the region of which the target thickness is less than a second preset value, and the simulated wafer.

For step S60, in one embodiment, the support layer may be a titanium nitride layer, and the sacrificial layer may be an oxide layer. The simulated wafer is etched by using an etching gas while the temperature control device heats the simulated wafer. The etching gas in the sacrificial layer is different from that in the support layer. The etching gas in the support layer may mainly be tetrafluoromethane ($CF_4$), and the etching gas in the sacrificial layer may mainly be hexafluoro-2-butyne ($C_4F_6$). The etch hole produced by etching is a capacitor hole.

Figure 4:
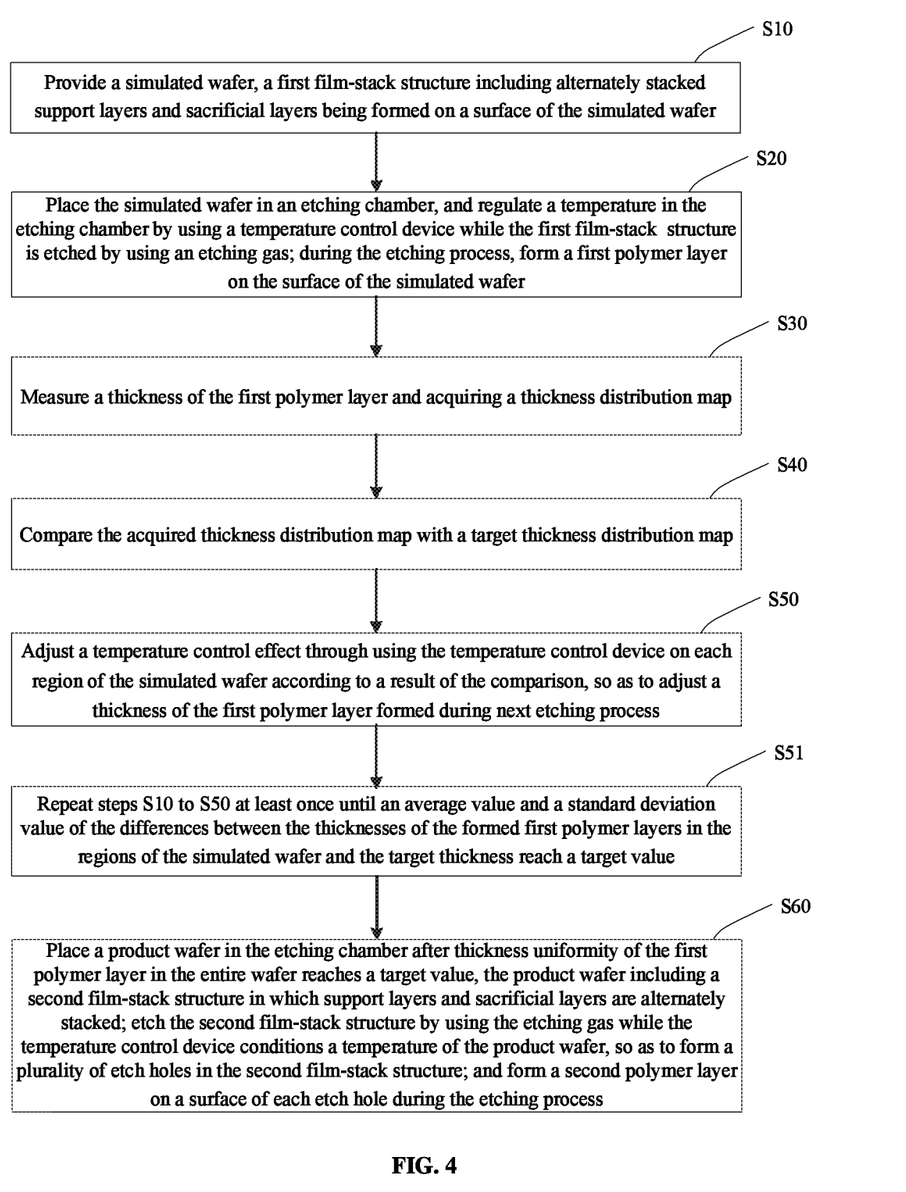
FIG. 4 is a flowchart of a semiconductor device fabrication method according to another embodiment of the present application.

As shown in FIG. 4, in one embodiment, after step S50 and prior to step S60, the following step is further included.

In step S51, steps S10 to S50 are repeated at least once until an average value and a standard deviation value of the differences between the thicknesses of the formed first polymer layers in the regions of the simulated wafer and the target thickness reach a target value.

For step S51, after initial adjustment, it cannot be determined whether the initial adjustment has achieved a desired purpose. Therefore, steps S10 to S50 are repeated at least once to enable the semiconductor equipment to be detected again after adjustment, and formal processing is performed until it is determined that thickness uniformity of the first polymer layers in the entire wafer is satisfied, which can further improve distribution uniformity of the second polymer layers in formal production.

Figure 5:
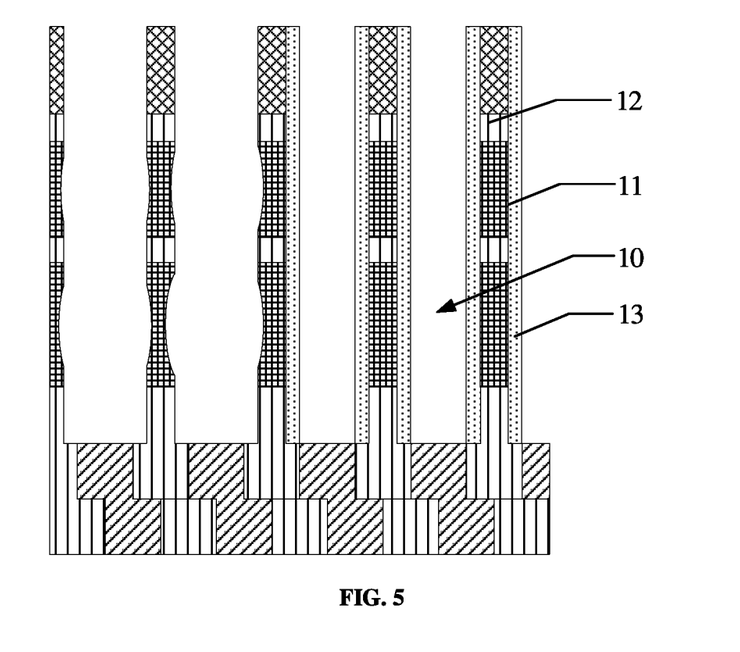
FIG. 5 is a schematic diagram of a sectional structure with uneven distribution of polymer layers formed on sidewalls of capacitor holes in different regions of a wafer after formation of the capacitor holes according to the prior art.

FIG. 5 is a schematic diagram of a sectional structure with uneven distribution of polymer layers formed on sidewalls of capacitor holes in different regions of a wafer after formation of the capacitor holes according to the prior art. As shown in FIG. 5, a height of a capacitor hole 10 is more than 2800 nm and the capacitor hole 10 passes through overlapping sacrificial layers 11 and support layers 12, an etching gas of the sacrificial layer 11 is different from that of the support layer 12, and the capacitor hole 10 formed by etching may have a certain depth, so the etching process may be a continuous process. Therefore, during the etching process, after an upper portion of the capacitor hole 10 is formed, a lower structure of the capacitor hole 10 is required to be formed by continuous downward etching. During the continuous etching process, the capacitor hole 10 is prone to side etching. During the etching process, a polymer layer 13 is formed on an inner wall of the capacitor hole 10, which can well prevent excessive side etching of the capacitor hole 10. However, due to a difference in temperatures and other conditions in different regions of the wafer during the etching process, thicknesses of polymer layers 13 formed on sidewalls of capacitor holes 10 in the different regions of the wafer are not uniform. For example, as shown in the drawing, the polymer layers 13 are not formed on the sidewalls of the capacitor holes 10 in some regions, while too thick polymer layers 13 may be formed on the sidewalls of the capacitor holes 10 in some other regions.

Figure 6:
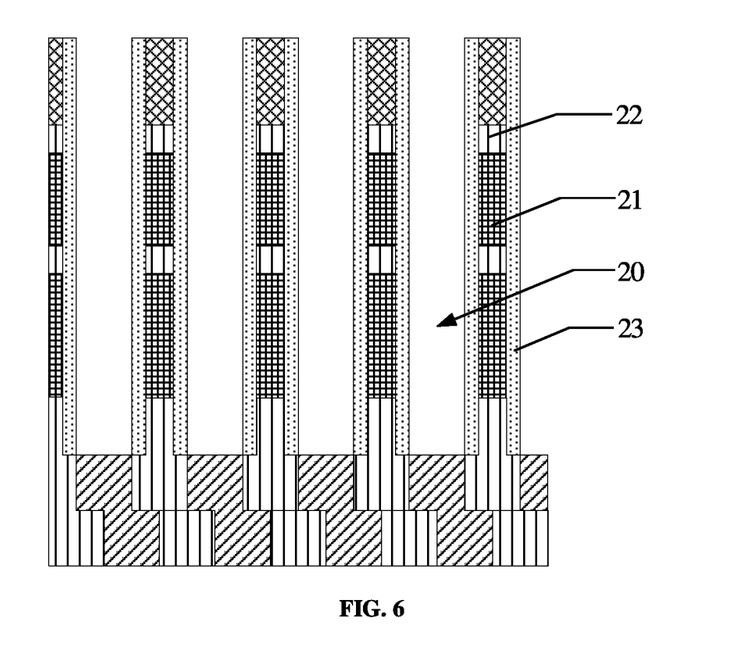
FIG. 6 is a schematic diagram of a sectional structure with even distribution of polymer layers formed on sidewalls of capacitor holes in different regions of a wafer after formation of the capacitor holes with the semiconductor device fabrication method according to the present application.

FIG. 6 is a schematic diagram of a sectional structure with even distribution of polymer layers formed on sidewalls of capacitor holes in different regions of a wafer after formation of the capacitor holes with the semiconductor device fabrication method according to the present application. As can be seen from FIG. 6, during a process of forming a capacitor hole 20 in a film-stack structure with alternately stacked support layers 22 and sacrificial layers 21, polymer layers 23 on sidewalls of the capacitor hole 20 in regions of the wafer have approximately a same thickness; that is, thicknesses of the polymer layers 23 have good uniformity.

With the above technical means, the thickness of the first polymer layer formed during the process of etching the simulated wafer is inversely proportional to the temperature of the simulated wafer, regions where first polymer layers are either too thick or too thin are detected based on formation of the first polymer layers on the simulated wafer, and distribution of thicknesses of the first polymer layers on a surface of the entire wafer can be controlled by adjusting the temperature control effect through using the temperature control device on each region of the simulated wafer, so as to achieve a purpose of improving distribution uniformity of second polymer layers in formal production.

The technical features in the above embodiments may be randomly combined. For concise description, not all possible combinations of the technical features in the above embodiments are described. However, all the combinations of the technical features are to be considered as falling within the scope described in this specification provided that they do not conflict with each other.

The above embodiments only describe several implementations of the present application, and their description is specific and detailed, but cannot therefore be understood as a limitation on the patent scope of the present application. It should be noted that those of ordinary skill in the art may further make variations and improvements without departing from the conception of the present application, and these all fall within the protection scope of the present application. Therefore, the patent protection scope of the present application should be subject to the appended claims.

What is claimed is:

1. A semiconductor equipment regulation method, comprising:
    providing a simulated wafer;
    placing the simulated wafer in an etching chamber, and conditioning a temperature in the etching chamber by using a temperature control device while performing an etching process on the simulated wafer by using an etching gas; during the etching process, a polymer layer is formed on a surface of the simulated wafer;
    measuring a thickness of the polymer layer and acquiring a thickness distribution map;
    comparing the acquired thickness distribution map with a target thickness distribution map; and
    adjusting a temperature control effect through using the temperature control device on each region of the simulated wafer according to a result of the comparison, so as to adjust a thickness of the polymer layer formed during a next etching process.

2. The semiconductor equipment regulation method according to claim 1, wherein the temperature control device comprises a plurality of separate heating plates; and the step of adjusting the temperature control effect through using the temperature control device on each region of the surface of the simulated wafer according to a result of the comparison comprises: adjusting a distance between each heating plate and the simulated wafer according to the result of the comparison to adjust the temperature control effect on each region of the surface of the simulated wafer.

3. The semiconductor equipment regulation method according to claim 2, wherein the thickness of the polymer layer formed during the etching process is inversely proportional to a temperature of a region of the simulated wafer, and the step of adjusting a distance between the heating plate and the simulated wafer according to the result of the comparison to adjust a temperature control effect of the heating plate on the simulated wafer comprises:
 positioning, according to the result of the comparison, a region of the simulated wafer where the thickness of the polymer layer differs from the target thickness; and
 adjusting the heating plate at a corresponding position of the region, decreasing a distance between the heating plate at the corresponding position and the simulated wafer if a difference between the thickness of the polymer layer in the region of which the target thickness in the corresponding region is greater than a first preset value, and increasing the distance between the heating plate at the corresponding position and the simulated wafer if the difference between the thickness of the polymer layer in the region of which the target thickness in the corresponding region is less than a second preset value.

4. The semiconductor equipment regulation method according to claim 1, wherein the next etching process comprises a process of etching a product wafer, and during the process of etching the simulated wafer, a flow rate of at least one etching gas is greater than that of a corresponding etching gas during the process of etching the product wafer, and/or etching power is less than that during the process of etching the product wafer.

5. The semiconductor equipment regulation method according to claim 1, further comprising: after the step of adjusting a temperature control effect through using the temperature control device on each region of the simulated wafer according to a result of the comparison,
 repeating the above steps at least once until an average value and a standard deviation value of the differences between the thicknesses of the formed polymer layers in the regions of the simulated wafer and the target thickness reach a target value.

6. A semiconductor device fabrication method, comprising:
 providing a simulated wafer, a first film-stack structure comprising alternately stacked support layers and sacrificial layers being formed on a surface of the simulated wafer;
 placing the simulated wafer in an etching chamber, and conditioning a temperature in the etching chamber by using a temperature control device while the first film-stack structure is etched by using an etching gas; during an etching process, forming a first polymer layer on the surface of the simulated wafer;
 measuring a thickness of the first polymer layer and acquiring a thickness distribution map;
 comparing the acquired thickness distribution map with a target thickness distribution map;
 adjusting a temperature control effect through using the temperature control device on each region of the simulated wafer according to a result of the comparison, so as to adjust a thickness of the first polymer layer formed during next etching process; and
 placing a product wafer in the etching chamber after thickness uniformity of the first polymer layer in the entire product wafer reaches a target value, the product wafer comprising a second film-stack structure in which support layers and sacrificial layers are alternately stacked; etching the second film-stack structure by using the etching gas while the temperature control device conditions a temperature of the product wafer, so as to form a plurality of etch holes in the second film-stack structure; and forming a second polymer layer on a surface of each etch hole during the etching process.

7. The semiconductor device fabrication method according to claim 6, wherein the temperature control device comprises a plurality of separate heating plates; and the step of adjusting a temperature control effect through using the temperature control device on each region of the surface of the simulated wafer according to a result of the comparison comprises: adjusting a distance between each heating plate and the simulated wafer according to the result of the comparison to adjust the temperature control effect on each region of the surface of the simulated wafer.

8. The semiconductor device fabrication method according to claim 7, wherein the thickness of the first polymer layer formed during the etching process of the simulated wafer is inversely proportional to a temperature of the simulated wafer, and the step of adjusting a distance between the heating plate and the simulated wafer according to the result of the comparison to adjust a temperature control effect of the heating plate on the simulated wafer comprises:
 positioning, according to the result of the comparison, a region of the simulated wafer where the thickness of the first polymer layer differs from the target thickness; and
 adjusting the heating plate at a corresponding position of the region, decreasing a distance between the heating plate at the corresponding position and the simulated wafer if a difference between the thickness of the first polymer layer in the region of which the target thickness in the corresponding region is greater than a first preset value, and increasing the distance between the heating plate at the corresponding position and the simulated wafer if the difference between the thickness of the first polymer layer in the region of which the target thickness in the corresponding region is less than a second preset value.

9. The semiconductor device fabrication method according to claim 6, wherein the next etching process comprises a process of etching a product wafer, and a flow rate of at least one etching gas during the process of etching the simulated wafer is greater than that of a corresponding etching gas during the process of etching the product wafer, and/or etching power during the process of etching the simulated wafer is less than that during the process of etching the product wafer.

10. The semiconductor device fabrication method according to claim 6, wherein the etch hole is a capacitor hole.

11. The semiconductor device fabrication method according to claim 6, wherein after the step of adjusting a temperature control effect through using the temperature control device on each region of the simulated wafer according to a result of the comparison, if the thickness uniformity of the first polymer layer in the entire product wafer does not reach the target value, prior to the step of placing a product wafer in the etching chamber, the method further comprises:

repeating the above steps at least once until an average value and a standard deviation value of the differences between the thicknesses of the formed first polymer layers in the regions of the simulated wafer and the target thickness reach the target value.

12. The semiconductor device fabrication method according to claim 7, wherein the plurality of separate heating plates are adjustably and fixedly connected to an inner wall or a top of the etching chamber.

13. The semiconductor device fabrication method according to claim 6, wherein the step of measuring a thickness of the first polymer layer and acquiring a thickness distribution map comprises:
    measuring the thickness of the first polymer layer through a measuring machine, and generating the thickness distribution map of the first polymer layer according to a measured value.

14. The semiconductor device fabrication method according to claim 6, wherein the step of comparing the acquired thickness distribution map with a target thickness distribution map comprises:
    calculating differences between thickness values on the acquired thickness distribution map and thickness values on the target thickness distribution map, and making the resulting differences into a difference distribution map.

15. The semiconductor device fabrication method according to claim 6, wherein the step of comparing the acquired thickness distribution map with a target thickness distribution map comprises:
    superposing the thickness distribution map and the target thickness distribution map for comparison to obtain a thickness difference map of regions of the thickness distribution map and the target thickness distribution map.

16. The semiconductor device fabrication method according to claim 6, wherein the simulated wafer is made of a silicon, germanium, GaAs, InP or GaN material.

* * * * *